United States Patent
Chen et al.

(10) Patent No.: US 9,671,450 B2
(45) Date of Patent: Jun. 6, 2017

(54) ARRAY SUBSTRATE, DISPLAY PANEL AND METHOD FOR DETECTING THE ARRAY SUBSTRATE

(71) Applicant: Shenzhen China Star Optoelectronics Technology Co., Ltd., Shenzhen, Guangdong (CN)

(72) Inventors: Cheng-Hung Chen, Guangdong (CN); Zui Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 279 days.

(21) Appl. No.: 14/435,542

(22) PCT Filed: Jan. 16, 2015

(86) PCT No.: PCT/CN2015/070834
§ 371 (c)(1),
(2) Date: Apr. 14, 2015

(87) PCT Pub. No.: WO2016/106863
PCT Pub. Date: Jul. 7, 2016

(65) Prior Publication Data
US 2016/0341779 A1    Nov. 24, 2016

(30) Foreign Application Priority Data

Dec. 30, 2014   (CN) .......................... 2014 1 0848799

(51) Int. Cl.
*G01R 31/02*   (2006.01)
*G09G 3/00*    (2006.01)
(Continued)

(52) U.S. Cl.
CPC ......... *G01R 31/025* (2013.01); *G02F 1/1343* (2013.01); *G09G 3/006* (2013.01);
(Continued)

(58) Field of Classification Search
CPC .... G01R 31/025; G09G 3/006; G09G 3/3607; G09G 2320/029; G09G 2330/12
(Continued)

(56) References Cited

U.S. PATENT DOCUMENTS

2011/0261307 A1*  10/2011  Shin ................. G02F 1/133753
                                                          349/123
2012/0086895 A1*  4/2012   Lee .................. G02F 1/133512
                                                          349/106

FOREIGN PATENT DOCUMENTS

CN         101324729 A  * 12/2008

OTHER PUBLICATIONS

CN101324729, 2008, Machine Translation, p. 1-12.*

* cited by examiner

*Primary Examiner* — Thomas Valone
(74) *Attorney, Agent, or Firm* — Andrew C. Cheng

(57) ABSTRACT

The disclosure is related to an array substrate, a display panel and a method for detecting the array substrate. The array substrate comprises a plurality of pixels arranged in an array. Each of the pixels comprises a plurality of sub-pixels arranged in sequence. Each of the sub-pixels is arranged opposite to a capacitor at an interval. Each sub-pixel comprises a sub-pixel electrode. At least one sub-pixel electrode comprises an extension portion. At least one extension portion of the sub-pixel electrode of the sub-pixel is arranged corresponding to the space between the adjacent sub-pixel and the capacitor corresponding to the adjacent sub-pixel.

10 Claims, 3 Drawing Sheets

(51) Int. Cl.
*G09G 3/36* (2006.01)
*G02F 1/1343* (2006.01)
(52) U.S. Cl.
CPC ..... *G09G 3/3607* (2013.01); *G09G 2320/029* (2013.01); *G09G 2330/12* (2013.01)
(58) Field of Classification Search
USPC .................................................. 324/760.01
See application file for complete search history.

ARRAY SUBSTRATE, DISPLAY PANEL AND METHOD FOR DETECTING THE ARRAY SUBSTRATE

CROSS REFERENCE TO RELATED APPLICATION

This application claims the benefit of, and priority to, Chinese Patent Application No. 201410848799.X, filed Dec. 30, 2014, titled "ARRAY SUBSTRATE, DISPLAY PANEL AND METHOD FOR DETECTING THE ARRAY SUBSTRATE", the contents of which are incorporated by reference herein in its entirety.

BACKGROUND OF THE INVENTION

1. Field of the Invention

The disclosure is related to a display technology field, and more particular to an array substrate, a display panel and a method for detecting the array substrate.

2. Description of Related Art

Liquid crystal display devices are common electronic apparatuses, and are widely used because of the advantages of lightweight and large viewing angle.

In order to improve the color shift occurring at the large viewing angle in the vertical alignment type liquid crystal display devices, the charge sharing pixels are usually adopted. In the charge sharing pixels, each pixel comprises three pixels arranged sequentially, for example, red sub-pixel (R), green sub-pixel (G) and blue sub-pixel (B). Each sub-pixel comprises a sub-pixel electrode. Each pixel is opposite to a charge sharing capacitor. A transparent conductive layer such as ITP is usually disposed at the upmost layer of the charge sharing capacitor. ITO may be left over during the manufacture process such that the charge sharing capacitor and the sub-pixel electrode may be short-circuited. When the charge sharing capacitor and the sub-pixel electrode are short-circuited, a microspot may occur on the display panel of the liquid crystal display device such that the display quality of the display panel is low. Further, the prior art cannot detect the short circuit between charge sharing capacitor and the sub-pixel electrode.

SUMMARY OF THE INVENTION

The disclosure provides an array substrate comprising a plurality of pixels arranged in an array; wherein each of the pixels comprises a plurality of sub-pixels arranged in sequence, each of the sub-pixels being arranged opposite to a capacitor at an interval; wherein each sub-pixel comprises a sub-pixel electrode; at least one sub-pixel electrode comprises an extension portion; at least one extension portion of the sub-pixel electrode of the sub-pixel is arranged corresponding to the space between the adjacent sub-pixel and the capacitor corresponding to the adjacent sub-pixel.

In one embodiment of the array substrate, each of the pixels comprises three sub-pixels arranged in sequence; the three sub-pixels arranged in sequence are a first sub-pixel, a second sub-pixel, and a third sub-pixel; the first sub-pixel is arranged opposite to a first capacitor at an interval; the second sub-pixel is arranged opposite to a second capacitor at an interval; the third sub-pixel is arranged opposite to a third capacitor at an interval; the first sub-pixel comprises a first sub-pixel electrode; the second sub-pixel comprises a second sub-pixel electrode; the third sub-pixel comprises a third sub-pixel electrode; the first sub-pixel electrode comprises a first extension portion; the first extension portion is arranged corresponding to the space between the second sub-pixel of the pixel and the second capacitor.

In one embodiment of the array substrate, the second sub-pixel electrode comprises a second extension portion; the second extension portion is arranged corresponding to the space between the third sub-pixel of the pixel and the third capacitor.

In one embodiment of the array substrate, the third sub-pixel electrode comprises a third extension portion; the third extension portion is arranged corresponding to the space between the first sub-pixel of the pixel adjacent to the pixel and the first capacitor.

The disclosure further provides a display panel comprising an array substrate comprising a plurality of pixels arranged in an array; wherein each of the pixels comprises a plurality of sub-pixels arranged in sequence, each of the sub-pixels being arranged opposite to a capacitor at an interval; wherein each sub-pixel comprises a sub-pixel electrode; at least one sub-pixel electrode comprises an extension portion; at least one extension portion of the sub-pixel electrode of the sub-pixel is arranged corresponding to the space between the adjacent sub-pixel and the capacitor corresponding to the adjacent sub-pixel.

In one embodiment of the display panel, each of the pixels comprises three sub-pixels arranged in sequence; the three sub-pixels arranged in sequence are a first sub-pixel, a second sub-pixel, and a third sub-pixel; the first sub-pixel is arranged opposite to a first capacitor at an interval; the second sub-pixel is arranged opposite to a second capacitor at an interval; the third sub-pixel is arranged opposite to a third capacitor at an interval; the first sub-pixel comprises a first sub-pixel electrode; the second sub-pixel comprises a second sub-pixel electrode; the third sub-pixel comprises a third sub-pixel electrode; the first sub-pixel electrode comprises a first extension portion; the first extension portion is arranged corresponding to the space between the second sub-pixel of the pixel and the second capacitor.

In one embodiment of the display panel, the second sub-pixel electrode comprises a second extension portion; the second extension portion is arranged corresponding to the space between the third sub-pixel of the pixel and the third capacitor.

In one embodiment of the display panel, the third sub-pixel electrode comprises a third extension portion; the third extension portion is arranged corresponding to the space between the first sub-pixel of the pixel adjacent to the pixel and the first capacitor.

The disclosure further discloses a method for detecting an array substrate, the array substrate comprising a plurality of pixels arranged in an array, each of the pixels comprising a plurality of sub-pixels arranged in sequence, each of the sub-pixels being arranged opposite to a capacitor at an interval, each sub-pixel comprising a sub-pixel electrode, at least one sub-pixel electrode comprising an extension portion, at least one extension portion of the sub-pixel electrode of the sub-pixel is arranged corresponding to the space between the adjacent sub-pixel and the capacitor corresponding to the adjacent sub-pixel, the method comprising sequentially turning on one color sub-pixel and observing the array substrate; determining whether the other colors exist except the turned on color on the array substrate; and determining the array substrate being normal when no other colors exist except the turned on color on the array substrate.

In one embodiment of the method for detecting an array substrate, when other colors exist except the turned on color on the array substrate, the extension portions of the sub-pixels of the other colors on the array substrate and the sub-pixel electrode of the sub-pixel of the color currently turned on and the corresponding capacitor are short-circuited.

Comparing with the current technology, the array substrate of the disclosure, the display panel comprising the array substrate and the method for detecting the array substrate of the disclosure configure the at least one sub-pixel electrode to have an extension portion, and dispose the extension portion of the sub-pixel electrode corresponding to the space between the adjacent sub-pixel electrode and the capacitor corresponding to the adjacent sub-pixel. When the sub-pixel of the each color in the array substrate is turned on sequentially, the short circuit between the extension portions of the sub-pixels of the other colors on the array substrate and the sub-pixel electrode of the sub-pixel of the color currently turned on and the corresponding capacitor may be determined by observing whether there are the other colors turned on except the currently turned on color on the array substrate.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor.

DETAILED DESCRIPTION OF THE PREFERRED EMBODIMENTS

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
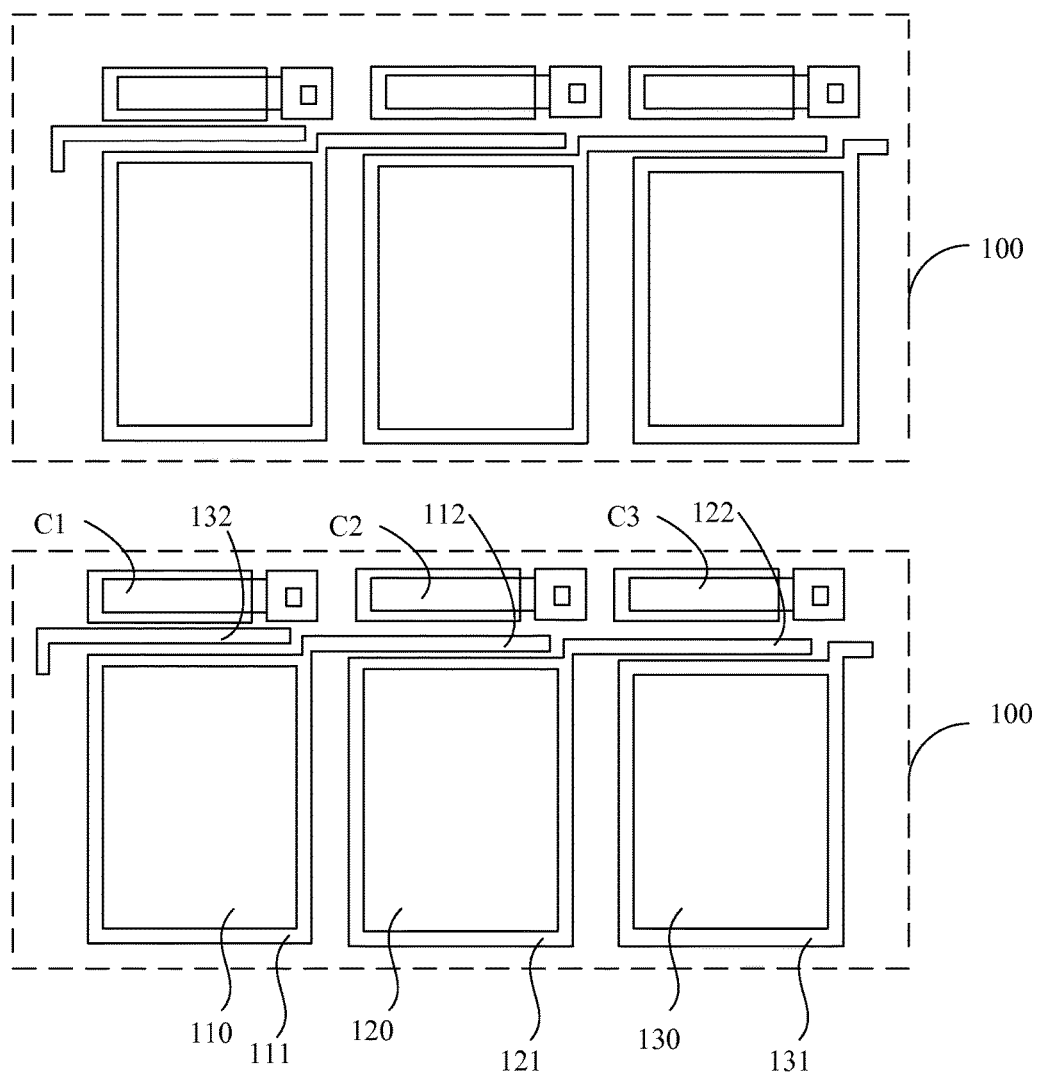
FIG. 1 is the schematic structure of the array substrate of the disclosure.

Refer to FIG. 1, which is the schematic structure of the array substrate of the disclosure. The array substrate 10 comprises a plurality of pixels 100 arranged in an array. Each of the pixels 100 comprises a plurality of sub-pixels arranged in sequence. Each of the sub-pixels is arranged opposite to a capacitor at an interval. Each sub-pixel comprises a sub-pixel electrode. At least one sub-pixel electrode comprises an extension portion. At least one extension portion of the sub-pixel electrode of the sub-pixel is arranged corresponding to the space between the adjacent sub-pixel and the capacitor corresponding to the adjacent sub-pixel. The exemplary embodiment for the pixel 100 comprising three sub-pixels is described as below.

Each of the pixels 100 comprises three sub-pixels arranged in sequence. The three sub-pixels arranged in sequence are a first sub-pixel 110, a second sub-pixel 120, and a third sub-pixel 130. The first sub-pixel 110 is arranged opposite to a first capacitor C1 at an interval. The second sub-pixel 120 is arranged opposite to a second capacitor C2 at an interval. The third sub-pixel 130 is arranged opposite to a third capacitor C3 at an interval. The first sub-pixel 110 comprises a first sub-pixel electrode 111. The second sub-pixel 120 comprises a second sub-pixel electrode 121. The third sub-pixel 130 comprises a third sub-pixel electrode 131. The first sub-pixel electrode 111 comprises a first extension portion 112. The first extension portion is arranged corresponding to the space between the second sub-pixel 120 of the pixel 100 and the second capacitor C2. The first sub-pixel 110, the second sub-pixel 120 and the third sub-pixel 130 are the combination of the red color, the green color and the blue color. In this exemplary embodiment, the first sub-pixel 110 is a red sub-pixel, the second sub-pixel 120 is a green sub-pixel, and the third sub-pixel 130 is a blue sub-pixel.

The second sub-pixel electrode 121 comprises a second extension portion 122. The second extension portion 122 is arranged corresponding to the space between the third sub-pixel 130 of the pixel 100 and the third capacitor C3.

The third sub-pixel electrode 131 comprises a third extension portion 132. The third extension portion 132 is arranged corresponding to the space between the first sub-pixel 110 of the pixel 100 adjacent to the pixel 100 and the first capacitor C1.

Determination whether the array substrate 10 is normal or a short circuit exists between the capacitor and the sub-pixel electrode is explained as below. The determination steps comprise sequentially turning on one color sub-pixel and observing the array substrate 10; determining whether the other colors exist except the turned on color on the array substrate 10; and determining the array substrate 10 being normal when no other colors exist except the turned on color on the array substrate. When other colors exist except the turned on color on the array substrate 10, the extension portions of the sub-pixels of the other colors on the array substrate 10 and the sub-pixel electrode of the sub-pixel of the color currently turned on and the corresponding capacitor are short-circuited. An example to turn on green sub-pixels is introduced. The determination steps comprise turning on the green sub-pixel (that is the second sub-pixel 120) and observing the array substrate 10; determining whether the other colors exist except the green color on the array substrate 10; and determining the array substrate 10 being normal when no other colors (for example red color or blue color, or red color and blue color) exist except the green color on the array substrate 100. When other colors exist except the green color on the array substrate 10, for example red color or blue color, or red color and blue color, an example that red color exists on the array substrate 10 when the green sub-pixel is turned on is introduced. At this time, the extension portion of the red color sub-pixel (that is the first sub-pixel 110) and the second sub-pixel electrode 120 and the second capacitor C2 is short-circuited. This shows that more conductive materials are left over at the space between the second sub-pixel electrode 120 and the second capacitor C2 corresponding to the second sub-pixel 120. It is necessary to clear the conductive materials left over between the second sub-pixel electrode 120 and the second capacitor C2 to increase the quality of the array substrate 10.

Figure 2:
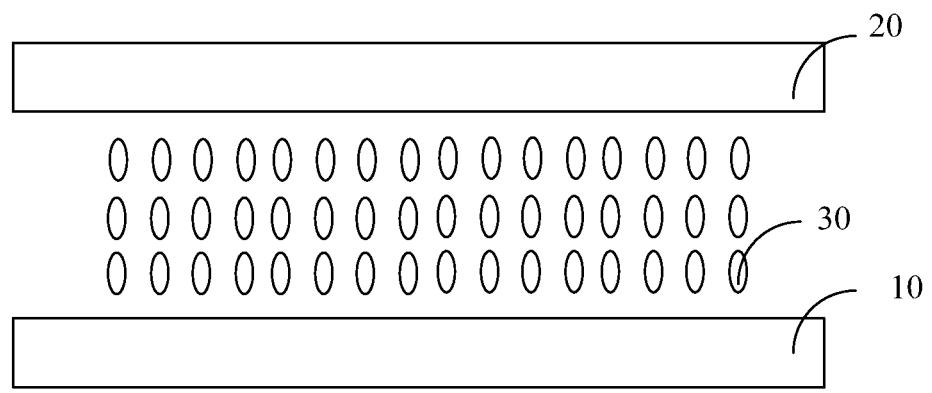
FIG. 2 is the schematic structure of the display panel of the disclosure.

The explanation on the display panel of the disclosure is given as below with reference to FIG. 1. Refer to FIG. 2, which is the schematic structure of the display panel of the disclosure. The display panel 1 comprises the array substrate 10 as shown in FIG. 1, a color filter substrate 20 and a liquid crystal layer 30. The array substrate 10 and the color filter substrate 20 are arranged opposite to each other. The liquid crystal layer 30 is disposed between the array substrate 10 and the color filter substrate 20.

The array substrate 10 comprises a plurality of pixels 100 arranged in an array. Each of the pixels 100 comprises a plurality of sub-pixels arranged in sequence. Each of the sub-pixels is arranged opposite to a capacitor at an interval. Each sub-pixel comprises a sub-pixel electrode. At least one sub-pixel electrode comprises an extension portion. At least one extension portion of the sub-pixel electrode of the sub-pixel is arranged corresponding to the space between the adjacent sub-pixel and the capacitor corresponding to the adjacent sub-pixel. The exemplary embodiment for the pixel 100 comprising three sub-pixels is described as below.

Each of the pixels 100 comprises three sub-pixels arranged in sequence. The three sub-pixels arranged in sequence are a first sub-pixel 110, a second sub-pixel 120, and a third sub-pixel 130. The first sub-pixel 110 is arranged opposite to a first capacitor C1 at an interval. The second sub-pixel 120 is arranged opposite to a second capacitor C2 at an interval. The third sub-pixel 130 is arranged opposite to a third capacitor C3 at an interval. The first sub-pixel 110 comprises a first sub-pixel electrode 111. The second sub-pixel 120 comprises a second sub-pixel electrode 121. The third sub-pixel 130 comprises a third sub-pixel electrode 131. The first sub-pixel electrode 111 comprises a first extension portion 112. The first extension portion is arranged corresponding to the space between the second sub-pixel 120 of the pixel 100 and the second capacitor C2. The first sub-pixel 110, the second sub-pixel 120 and the third sub-pixel 130 are the combination of the red color, the green color and the blue color. In this exemplary embodiment, the first sub-pixel 110 is a red sub-pixel, the second sub-pixel 120 is a green sub-pixel, and the third sub-pixel 130 is a blue sub-pixel.

The second sub-pixel electrode 121 comprises a second extension portion 122. The second extension portion 122 is arranged corresponding to the space between the third sub-pixel 130 of the pixel 100 and the third capacitor C3.

The third sub-pixel electrode 131 comprises a third extension portion 132. The third extension portion 132 is arranged corresponding to the space between the first sub-pixel 110 of the pixel 100 adjacent to the pixel 100 and the first capacitor C1.

Determination whether the array substrate 10 is normal or a short circuit exists between the capacitor and the sub-pixel electrode is explained as below. The determination steps comprise sequentially turning on one color sub-pixel and observing the array substrate 10; determining whether the other colors exist except the turned on color on the array substrate 10; and determining the array substrate 10 being normal when no other colors exist except the turned on color on the array substrate. When other colors exist except the turned on color on the array substrate 10, the extension portions of the sub-pixels of the other colors on the array substrate 10 and the sub-pixel electrode of the sub-pixel of the color currently turned on and the corresponding capacitor are short-circuited. An example to turn on green sub-pixels is introduced. The determination steps comprise turning on the green sub-pixel (that is the second sub-pixel 120) and observing the array substrate 10; determining whether the other colors exist except the green color on the array substrate 10; and determining the array substrate 10 being normal when no other colors (for example red color or blue color, or red color and blue color) exist except the green color on the array substrate 100. When other colors exist except the green color on the array substrate 10, for example red color or blue color, or red color and blue color, an example that red color exists on the array substrate 10 when the green sub-pixel is turned on is introduced. At this time, the extension portion of the red color sub-pixel (that is the first sub-pixel 110) and the second sub-pixel electrode 120 and the second capacitor C2 is short-circuited. This shows that more conductive materials are left over at the space between the second sub-pixel electrode 120 and the second capacitor C2 corresponding to the second sub-pixel 120. It is necessary to clear the conductive materials left over between the second sub-pixel electrode 120 and the second capacitor C2 to increase the quality of the array substrate 10.

Figure 3:
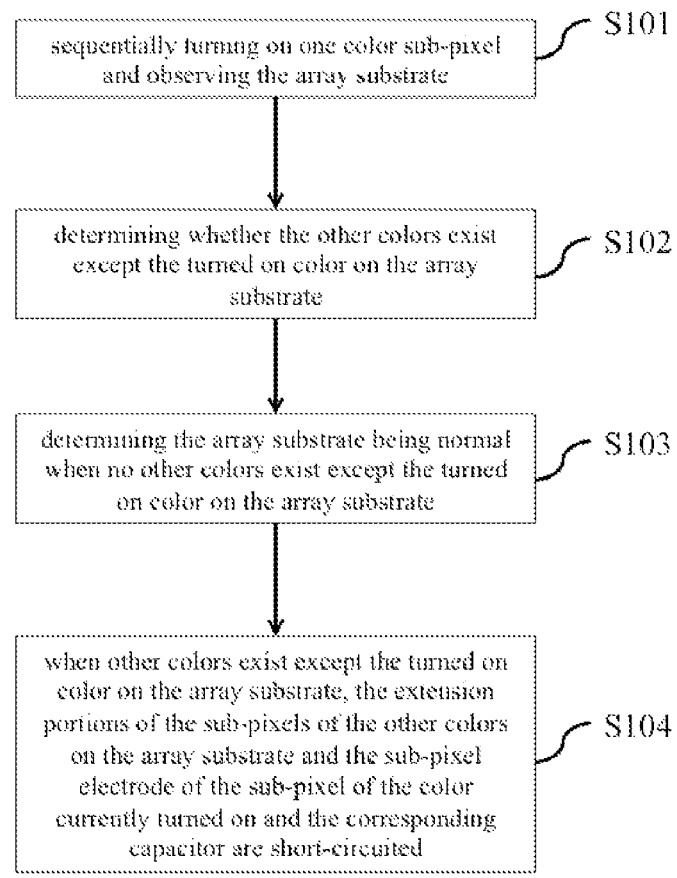
FIG. 3 is the flow chart of the method for detecting the array substrate of the disclosure.

The explanation on the method of the display panel of the disclosure is given as below with reference to FIG. 1 and FIG. 2. Refer to FIG. 3 together, which is the flow chart of the method for detecting the array substrate of the disclosure. The method for detecting the array substrate comprises but not limited to the following steps.

Step S101: sequentially turning on one color sub-pixel and observing the array substrate 10;

Step S102: determining whether the other colors exist except the turned on color on the array substrate 10;

Step S103: determining the array substrate 10 being normal when no other colors exist except the turned on color on the array substrate; and Step S104: when other colors exist except the turned on color on the array substrate 10, the extension portions of the sub-pixels of the other colors on the array substrate 10 and the sub-pixel electrode of the sub-pixel of the color currently turned on and the corresponding capacitor are short-circuited.

An example to turn on green sub-pixels is introduced. The determination steps comprise turning on the green sub-pixel (that is the second sub-pixel 120) and observing the array substrate 10; determining whether the other colors exist except the green color on the array substrate 10; and determining the array substrate 10 being normal when no other colors (for example red color or blue color, or red color and blue color) exist except the green color on the array substrate 100. When other colors exist except the green color on the array substrate 10, for example red color or blue color, or red color and blue color, an example that red color exists on the array substrate 10 when the green sub-pixel is turned on is introduced. At this time, the extension portion of the red color sub-pixel (that is the first sub-pixel 110) and the second sub-pixel electrode 120 and the second capacitor C2 is short-circuited. This shows that more conductive materials are left over at the space between the second sub-pixel electrode 120 and the second capacitor C2 corresponding to the second sub-pixel 120. It is necessary to clear the conductive materials left over between the second sub-pixel electrode 120 and the second capacitor C2 to increase the quality of the array substrate 10.

Comparing with the current technology, the array substrate of the disclosure, the display panel comprising the array substrate and the method for detecting the array substrate of the disclosure configure the at least one sub-pixel electrode to have an extension portion, and dispose the extension portion of the sub-pixel electrode corresponding to the space between the adjacent sub-pixel electrode and the capacitor corresponding to the adjacent sub-pixel. When the sub-pixel of the each color in the array substrate 10 is turned on sequentially, the short circuit between the extension portions of the sub-pixels of the other colors on the array substrate 10 and the sub-pixel electrode of the sub-pixel of the color currently turned on and the corresponding capacitor may be determined by observing whether there are the other colors turned on except the currently turned on color on the array substrate 10.

The above disclosure is merely an embodiment of the disclosure and does not intend to limit the claim scope of the disclosure. Those having ordinary knowledge in the related art may realize all or part of the process to achieve the above embodiments and may conduct equivalent variation on the claims of the disclosure, which belongs to the scope covered by the disclosure.

What is claimed is:

1. An array substrate, comprising:
    a plurality of pixels arranged in an array;
    wherein each of the pixels comprises a plurality of sub-pixels arranged in sequence, each of the sub-pixels being arranged opposite to a capacitor at an interval;
    wherein each sub-pixel comprises a sub-pixel electrode; at least one sub-pixel electrode comprises an extension portion; at least one extension portion of the sub-pixel electrode of the sub-pixel is arranged corresponding to the space between the adjacent sub-pixel and the capacitor corresponding to the adjacent sub-pixel.

2. The array substrate according to claim 1, wherein each of the pixels comprises three sub-pixels arranged in sequence; the three sub-pixels arranged in sequence are a first sub-pixel, a second sub-pixel, and a third sub-pixel; the first sub-pixel is arranged opposite to a first capacitor at an interval; the second sub-pixel is arranged opposite to a second capacitor at an interval; the third sub-pixel is arranged opposite to a third capacitor at an interval; the first sub-pixel comprises a first sub-pixel electrode; the second sub-pixel comprises a second sub-pixel electrode; the third sub-pixel comprises a third sub-pixel electrode; the first sub-pixel electrode comprises a first extension portion; the first extension portion is arranged corresponding to the space between the second sub-pixel of the pixel and the second capacitor.

3. The array substrate according to claim 1, wherein the second sub-pixel electrode comprises a second extension portion; the second extension portion is arranged corresponding to the space between the third sub-pixel of the pixel and the third capacitor.

4. The array substrate according to claim 3, wherein the third sub-pixel electrode comprises a third extension portion; the third extension portion is arranged corresponding to the space between the first sub-pixel of the pixel adjacent to the pixel and the first capacitor.

5. A display panel, comprising:
    an array substrate comprising a plurality of pixels arranged in an array;
    wherein each of the pixels comprises a plurality of sub-pixels arranged in sequence, each of the sub-pixels being arranged opposite to a capacitor at an interval;
    wherein each sub-pixel comprises a sub-pixel electrode;
    at least one sub-pixel electrode comprises an extension portion; at least one extension portion of the sub-pixel electrode of the sub-pixel is arranged corresponding to the space between the adjacent sub-pixel and the capacitor corresponding to the adjacent sub-pixel.

6. The display panel according to claim 5, wherein each of the pixels comprises three sub-pixels arranged in sequence; the three sub-pixels arranged in sequence are a first sub-pixel, a second sub-pixel, and a third sub-pixel; the first sub-pixel is arranged opposite to a first capacitor at an interval; the second sub-pixel is arranged opposite to a second capacitor at an interval; the third sub-pixel is arranged opposite to a third capacitor at an interval; the first sub-pixel comprises a first sub-pixel electrode; the second sub-pixel comprises a second sub-pixel electrode; the third sub-pixel comprises a third sub-pixel electrode; the first sub-pixel electrode comprises a first extension portion; the first extension portion is arranged corresponding to the space between the second sub-pixel of the pixel and the second capacitor.

7. The display panel according to claim 6, wherein the second sub-pixel electrode comprises a second extension portion; the second extension portion is arranged corresponding to the space between the third sub-pixel of the pixel and the third capacitor.

8. The display panel according to claim 7, wherein the third sub-pixel electrode comprises a third extension portion; the third extension portion is arranged corresponding to the space between the first sub-pixel of the pixel adjacent to the pixel and the first capacitor.

9. A method for detecting an array substrate, the array substrate comprising a plurality of pixels arranged in an array, each of the pixels comprising a plurality of sub-pixels arranged in sequence, each of the sub-pixels being arranged opposite to a capacitor at an interval, each sub-pixel comprising a sub-pixel electrode, at least one sub-pixel electrode comprising an extension portion, at least one extension portion of the sub-pixel electrode of the sub-pixel is arranged corresponding to the space between the adjacent sub-pixel and the capacitor corresponding to the adjacent sub-pixel, the method comprising:
    sequentially turning on one color sub-pixel and observing the array substrate;
    determining whether the other colors exist except the turned on color on the array substrate; and
    determining the array substrate being normal when no other colors exist except the turned on color on the array substrate.

10. The method for detecting an array substrate according to claim 9, wherein when other colors exist except the turned on color on the array substrate, the extension portions of the sub-pixels of the other colors on the array substrate and the sub-pixel electrode of the sub-pixel of the color currently turned on and the corresponding capacitor are short-circuited.

* * * * *